(12) United States Patent
Basu et al.

(10) Patent No.: US 11,474,921 B2
(45) Date of Patent: Oct. 18, 2022

(54) LOG COMPRESSION

(71) Applicant: Micron Technology, Inc., Boise, ID (US)

(72) Inventors: Reshmi Basu, Boise, ID (US); Libo Wang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 16/927,030

(22) Filed: Jul. 13, 2020

(65) Prior Publication Data

US 2022/0012146 A1   Jan. 13, 2022

(51) Int. Cl.
| | |
|---|---|
| *H03M 7/30* | (2006.01) |
| *G06F 3/06* | (2006.01) |
| *G06F 16/18* | (2019.01) |
| *G06F 16/174* | (2019.01) |
| *G06F 12/04* | (2006.01) |
| *G06F 11/34* | (2006.01) |
| *G06F 11/30* | (2006.01) |

(52) U.S. Cl.
CPC ........ *G06F 11/3037* (2013.01); *G06F 3/0608* (2013.01); *G06F 3/0652* (2013.01); *G06F 3/0653* (2013.01); *G06F 3/0679* (2013.01); *G06F 11/3068* (2013.01); *G06F 11/3075* (2013.01)

(58) Field of Classification Search
None
See application file for complete search history.

(56) References Cited

U.S. PATENT DOCUMENTS

| | | | |
|---|---|---|---|
| 7,653,633 B2 | 1/2010 | Villella et al. | |
| 7,778,979 B2 | 8/2010 | Hatonen et al. | |
| 9,166,989 B2 | 10/2015 | Huang et al. | |
| 9,619,478 B1 * | 4/2017 | Singh | G06F 17/40 |
| 10,698,927 B1 * | 6/2020 | Chin | G06F 9/547 |

(Continued)

OTHER PUBLICATIONS

Hazem Nomer, "Recursive Neural Networks Review", Jun. 2016, pp. 1-7, file:///C:/Users/cbirkhimer/Downloads/RecursiveNeuralNetworks.pdf (Year: 2016).*

(Continued)

*Primary Examiner* — Christopher D Birkhimer
(74) *Attorney, Agent, or Firm* — Brooks, Cameron & Huebsch, PLLC

(57) ABSTRACT

Systems, apparatuses, and methods related log compression are described. In an example, a system log that identifies targeted data may be compiled in a memory resource during an execution of an operation using that memory resource. The system log may be analyzed utilizing a portion of the memory resource that would otherwise be available to be utilized in the execution of the operation. The system log may be compressed during the execution of the operation, the level or timing of such compression may be based on the analysis that occurs contemporaneous to or as a result of executing the operation. In some examples, compressing the system log may include discarding a portion of the system log. Compressing the system log may also include extracting the targeted data from the system log as the system log is being compiled and converting the extracted targeted data to structured data.

20 Claims, 3 Drawing Sheets

(56) References Cited

U.S. PATENT DOCUMENTS

| | | | | |
|---|---|---|---|---|
| 2005/0138483 A1* | 6/2005 | Hatonen | G06F 21/552 | 714/45 |
| 2005/0213511 A1* | 9/2005 | Reece, Jr. | H04W 24/00 | 370/252 |
| 2006/0161593 A1* | 7/2006 | Mori | G16H 40/40 | |
| 2009/0193494 A1* | 7/2009 | Ratliff | G06N 3/006 | 726/1 |
| 2009/0228509 A1* | 9/2009 | McCarthy | H04L 67/1095 | |
| 2010/0051787 A1* | 3/2010 | Hirose | H03K 17/785 | 250/214 DC |
| 2012/0002716 A1* | 1/2012 | Antonellis | H04N 19/14 | 375/240.01 |
| 2013/0103982 A1* | 4/2013 | Chelliah | H03M 7/3088 | 714/20 |
| 2014/0013334 A1* | 1/2014 | Bisdikian | G06F 11/0709 | 719/313 |
| 2014/0344511 A1* | 11/2014 | Kim | G06F 11/0778 | 711/105 |
| 2015/0043019 A1* | 2/2015 | Tanaka | H04N 1/0083 | 358/1.13 |
| 2017/0351461 A1* | 12/2017 | Itani | G06F 17/40 | |
| 2020/0134029 A1* | 4/2020 | Savir | G06N 20/00 | |
| 2020/0134046 A1* | 4/2020 | Natanzon | H03M 7/70 | |

OTHER PUBLICATIONS

Techterms, "Operating System", Jul. 23, 2016, pp. 1-5, https://techterms.com/definition/operating_system (Year: 2016).*

Theydiffer, "Difference Between Volatile and Non-Volatile Memory", Jun. 9, 2015, pp. 1-3; https://theydiffer.com/difference-between-volatile-and-non-volatile-memory/ (Year: 2015).*

Microsoft, "Computer Dictionary", Fifth Edition, 2002, pp. 367, 378, and 558 (Year: 2002).*

* cited by examiner

LOG COMPRESSION

TECHNICAL FIELD

The present disclosure relates generally to semiconductor memory and methods, and more particularly, to methods and systems related log compression.

BACKGROUND

A log may be compiled as a computing system is executing. For example, as a computing system executes instructions to perform various operations, a log file may be compiled which records events that take place during the execution. In some examples, the events may be logged by an operating system and/or by an application executing on the computing system. A log may be compiled within a memory resource that is being utilized by the computing system in the execution of an underlying operation. A log may be compiled in the memory resource until the operation is completed, at which time the log may be analyzed and/or exported from the memory resource.

DETAILED DESCRIPTION

Figure 1:
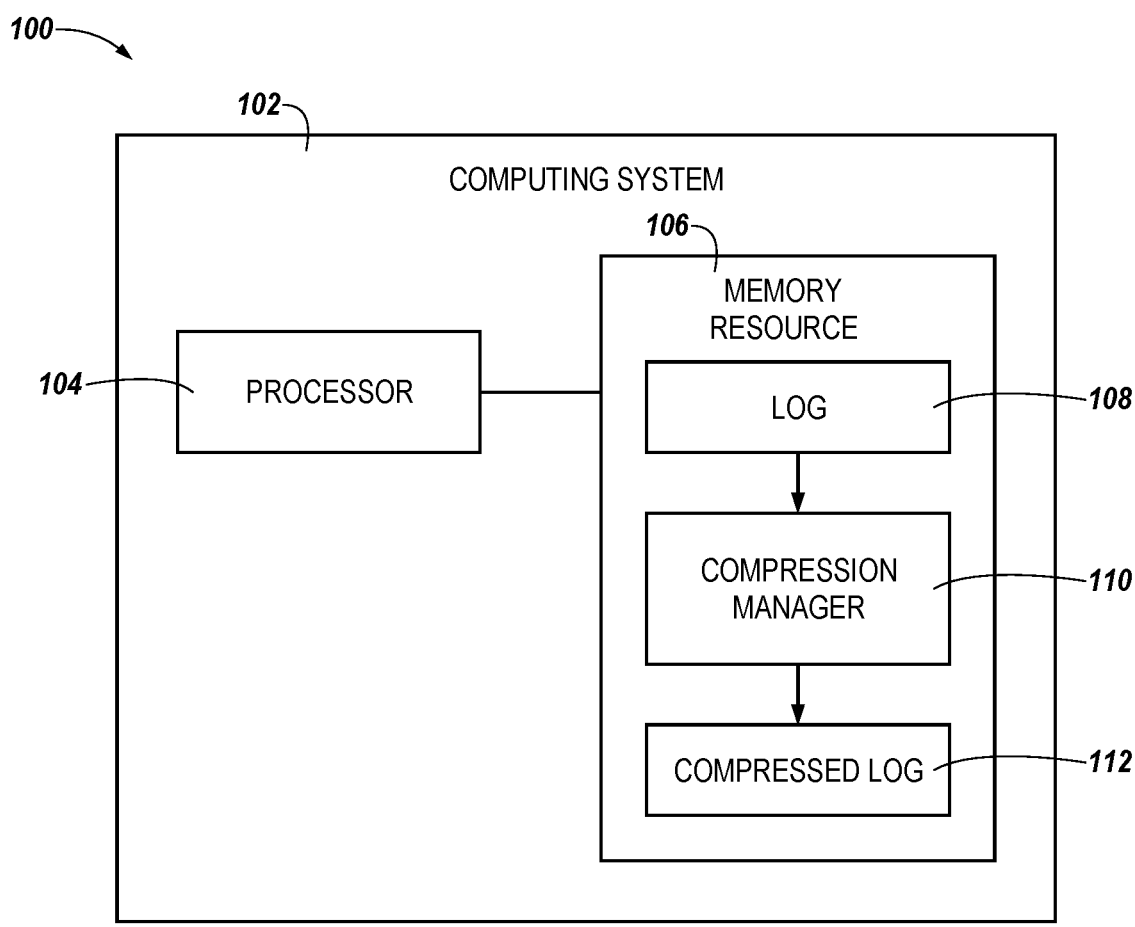
FIG. 1 illustrates an example of a system for log compression consistent with the present disclosure.

A computing system may include a processor. The processor may include electronic circuitry within the computing system that executes instructions making up a computing program. The processor may include a central processing unit (CPU) of the computing system.

The computing system may include one or more memory resources. For example, a computing system may include a non-transitory machine-readable medium for storing instructions executable by the processor to complete various computing operations.

In some examples, the memory may include memory that is available for an operating system, computing program, and/or process to utilize when executing the various computing operations. This memory may be volatile memory that may temporarily store instructions for, and data generated from executions of the computing program by the processor. For example, the memory may include a random-access memory (RAM) that is faster, but more expensive than other memory resources such as non-volatile memory resources or hard drives available at a computing system.

A computing system may have a computational capacity. A computational capacity may include a capacity of the computing system to execute various mounts of computing operations. The computational capacity may include the limits of a computing system to execute various instructions and/or process various amounts of data.

The computational capacity of a computing system may be defined by a plurality of factors. One factor may include the speed of a processor. The speed of the processor may refer to the clock speed for a number of processor cores which may define the number of operations a processor may perform within a given time.

However, additional factors may limit the computational capacity of a computing system. For example, as described above, the computing system may utilize a volatile memory resource (e.g., RAM) in executing its computing operations. For example, a processor core may receive instructions from a computing operation and, working with the clock speed, rapidly process this information and temporarily store it in the volatile memory resource. As such, the storage capacity of the volatile memory resource may also serve as a limit on the computational capacity of a computing system.

For example, when a computing system is executing computing operations, the data being utilized to execute the operation, the data resulting from the execution, and/or log files related to and compiled from the execution may begin to fill the RAM of a computing system. For example, as described above, a log may be compiled in the memory resource until the operation is completed, at which time the log may be analyzed and/or exported from the memory resource. As such, the compilation of log files during execution may be a contributor, among others, to the consumption of memory resource capacity.

When the RAM capacity is filled, attempts at additional operations or the creation of additional data may result in an "out of memory" error. In these instances, the underlying computing program being executed may become unstable and/or crash. Additionally, the computing operations being executed may be halted, interrupted, and/or retarded. As a result, execution of the computing operation may be adversely affected along with the user experience relying on the execution of such operations.

In some examples, additional volatile memory may be added to and/or allocated to a computing system in order to avoid running out of memory during execution of a computing operation. However, the volatile memory utilized in performing these executions may add additional expense to the computing system and/or its use. For example, RAM memory may be thousands of times more expensive per unit of storage than hard drive storage. As such, the addition of volatile memory to a computing system may impose a significant cost increase to the acquisition and/or utilization of the computing system.

In contrast, examples consistent with the present disclosure may include a mechanism to conserve the capacity of a memory resource being utilized in the execution of a computing operation. In contrast to examples which rely on the addition of supplemental memory resources to execute computing operations, examples consistent with the present disclosure may compress data associated with the execution of the computing operation within the memory resource during execution of the computing operation.

For instance, examples consistent with the present disclosure may include a method comprising analyzing, during an execution of an operation from which a system log is compiled in a memory resource utilized in the execution of the operation, the system log to identify targeted data within the system log, wherein the analysis is performed utilizing a portion of the memory resource that would otherwise be available to be utilized in the execution of the operation. The method can include compressing, during the execution of the operation, the system log within the memory resource based the analysis.

Examples consistent with the present disclosure may include a system comprising a processor and a non-transitory machine-readable medium to store instructions executable by the processor to analyze a system log, as it is being compiled from an execution of a main program operation, to identify targeted data within the system log and discard, from a portion of a memory resource utilized in the execution of the main program, a portion of the system log based on targeted data identified within the system log.

Examples consistent with the present disclosure may include a non-transitory machine-readable storage medium comprising instructions executable by a processor to identify targeted data within a system log, as it is being compiled from an execution of a main program, to identify targeted data within the system log. The instructions can be executable to extract, from a portion of a volatile memory resource utilized in the execution of the main program, the targeted data identified within the system log as the system log is being compiled and convert the extracted targeted data to structured data.

FIG. 1 illustrates an example of a system 100 for log compression consistent with the present disclosure. The system 100 may include a computing system 102. The described components and/or operations of the system 100 may include and/or be interchanged with the described components and/or operations described in relation to FIG. 2-FIG. 4.

The computing system 102 may include a computing device such as a computer, a laptop computer, a desktop computer, a smartphone, a wearable computer, a smart accessory, an internet-of-things (IOT) device, a smart appliance, a smart environmental control device, a server, a distributed computing system, a cloud-based computing platform, a virtual machine, etc. The computing system 102 may utilize computational resources such as a processor 104 and a memory resource 106 to perform computational operations.

For example, the computing system 102 may include a processor 104. A processor 104 may include electronic circuitry to execute instructions making up a computing program. For example, a processor 104 may include electronic circuitry to perform (e.g., execute) arithmetic, logic, controlling, and/or input/output operations specified by machine-readable instructions.

The computing system 102 may include a memory resource 106. The memory resource 106 may include a volatile memory resource. For example, the memory resource 106 may include a RAM memory resource. For example, the memory resource 106 may include a dynamic random-access memory (DRAM) resource or a static random-access memory (SRAM) resource.

The memory resource 106 may be a memory resource that is responsible for holding instructions and/or data associated with executing a computing operation of a computing application only while the computing application is executing. When the computing system 102 is executing a computing operation of a computing program, the instructions from the computing program to complete the computing operation may be stored in the memory resource 106. The processor 104 may retrieve the instructions from the memory resource 106. The processor 104 may execute the instructions from the memory resource 106 to perform a computing operation. The memory resource 106 may be utilized to store the data underlying and/or being produced by the computing operation as the instructions are executed.

For example, a computing system 102 may utilize the processor 104 to execute a data modeling operation of a data modeling application. The memory resource 106 may, during the execution of the data modeling operation, store the instructions for performing the data modeling operation, data modeling algorithms to be applied to raw data, the raw data being plugged into the data modeling algorithms, and data being output from the application of the data modeling algorithms to the raw data. The processor 104 may retrieve this data from the memory resource 106 and/or save this data to the memory resource 106.

In addition, the memory resource 106 may include a log 108. A log 108 may include a system log. The log 108 may include a file that is used to compile and/or record data regarding events that occur during an operating system or other computing application execution. For example, data about device changes, device drivers, system changes, events, operations, errors, warnings, startup messages, abnormal shutdowns, etc. may be compiled in the log 108. That is, the log 108 may be where data about the software, hardware, system processes, and system components is compiled along with whether processes have loaded successfully or not. The data in the log 108 may be utilized to diagnose the source of problems with the computing system 102 and/or predict potential system issues.

The data to be compiled in the log 108 may be generated by and/or during the execution of a computing operation. That is, as the instructions for performing a computing operation of a computing program are retrieved from the memory resource 106 and executed by the processor 104, the data that makes up the log 108 may be being generated and compiled in a log 108 in the memory resource 108. As such, the data compiled in the log 108 may consume a portion of the memory resource 106 that may otherwise be available to be utilized in the execution of the computing operation (e.g., to hold additional instructions related to the execution of the computing operation, to hold additional input data related to the execution of the computing operation, to hold additional data produced by the execution of the computing operation, etc.).

The log 108 may be compiled until the execution of the underlying computing operation is completed. That is, the log 108 may be generated from data created by the execution of the instructions for completing a computing operation. The log 108 may continue to be compiled until execution of the instructions for the computing operation is completed. As long as the instructions for the computing operation are still being executed, the log 108 may continue to be compiled. In some examples, once execution of the instructions for completing the computing operation is concluded, but not before, the log file 108 may be analyzed and/or exported from the memory resource 106.

The log 108 may contain a large amount of data. That is, the longer or more complex the computing operation, the more data that its execution may generate for compilation in the log 108. For example, a data modeling operation for a data modeling computing program may be executed on a large data set. The execution of the data modeling operation may include the application of a data model to a large data set which may take minutes, hours, days, etc. to complete. During this entire period, a log 108 of the events occurring during and/or by the execution may be being compiled in the memory resource 106. The log 108 may reach hundreds of millions, or even more, event logs. As described above, this data being compiled into the log 108 may be consuming a portion of the memory resource 106 and edging the computing system 102 ever closer to an out of memory error.

In contrast to previous mechanisms that continue to compile the log 108 until the once execution of the instructions for completing the computing operation is concluded, examples consistent with the present disclosure may include a compression manager 110 that may act on the data being compiled in the log 108 during the execution of the instructions for completing the computing operation, prior to completion of the execution of the instructions for completing the computing operation, and/or before compilation of the data from the computing operation into the log 108 is completed. The compression manager 110 may include instructions retrievable from the memory resource 106 and executable by the processor 104 to perform the compressing operations described herein. The compression manager 110 may include a thread of execution that is smaller than the computing operation of the main computing program whose computing operation is being executed by the processor 104 and, therefore, consumes less of the memory resource 106 capacity. Likewise, the compression manager 110 may include a thread of execution that consumes less processing capacity of the processor 104 than the main computing program whose computing operation is being executed by the processor 104.

The compression manager 110 may include instructions that are executed by the processor 104 simultaneous with the execution of the instructions for performing the computing operation of the main computing program. That is, the instructions for the compressing operations described herein may be executed concurrently with the instructions for the computing operation of the main computing program being executed by the processer 104.

The compression manager 110 may include instructions executable by the processor 104 to analyze the log 108. Analyzing the log 108 may include analyzing the data of the log 108 as it is being compiled. That is, analyzing the log 108 may include analyzing the data of the log 108 during and/or simultaneous with an execution of a computing operation from which the log 108 is being compiled. Analyzing the log 108 may include analyzing the data being compiled within the log 108 simultaneous with its creation and/or its compilation into the log 108. Analyzing the log 108 may include analyzing the data being compiled in the log 108 prior to a completion of the execution of the computing operation of the main program.

Analyzing the log 108 may include analyzing the data in the log 108 to identify targeted data within the log 108. For example, analyzing the log 108 may include searching the data being compiled in the log 108 for targeted data.

Targeted data may include data that a user, administrator, analytics platform, etc. may identify as data of interest. For example, targeted data may include data that is indicative of particular events, problems, issues, etc. that are of particular interest to a user, administrator, analytics platform etc. The targeted data may include data that is identified as being of particular use in performing analysis of interest to the user, administrator, analytics platform, etc. The targeted data may include data that is commonly associated with typical problems or events of particular interest to a user, administrator, analytics platform etc. Therefore, the targeted data may include data that is indicative of itself and/or preceding data being candidates for being retained within a compressed log 112 described in detail below.

Alternatively, the targeted data may include data that is indicative of normal and/or error-free execution by the computing system 102. As such, the targeted data may include data that is indicative of a lack of particular events, problems, issues, etc. that are of particular interest to a user, administrator, analytics platform etc. Therefore, the targeted data may include data that is indicative of itself and/or preceding data being candidates for removal from the log 108. As with the targeted data indicative of problems described above, the targeted data indicative of error-free execution may be user-specific, administrator-specific, analytics platform-specific, etc. and its definition may be derived from those sources.

In some examples, the targeted data may be designated by the user, administrator, analytics platform etc. That is, the identity of the targeted data may be configurable by and/or unique to a particular user, administrator, analytics platform etc. of the computing system 102. As such, the targeted data may be different depending on which user, administrator, analytics platform etc. is associated with and/or instigating the execution of the computing operation that is generating the data being compiled into the log 108.

Searching the data in the log 108 for the targeted data may include performing text searches of the data being compiled in the log 108. The text searches of the data may utilize keyword extraction of the text compiled in the log 108 in order to identify targeted data. For example, the data being compiled in the log 108 may be searched for specific text, words, phrases, and/or sequences of characters that are indicative of and/or are themselves the targeted data. The text searches of the data may be conducted as regular expression searches, context-free grammar searches, etc. that identify specific text, words, phrases, and/or sequences of characters among the data being compiled in the log 108.

For example, the appearance of a particular phrase in the log 108 may be indicative of an error and/or an event leading to an error that is of particular interest to an administrator. As such, searching the data log may include performing a text search of the data being compiled in the log 108 for that phrase.

Alternatively, the appearance of a particular phrase in the log 108 may be indicative that the preceding data and/or events compiled in the log 108 are correct and/or non-erroneous and, as such, of little interest to an administrator. As such, searching the data log may include performing a text search of the data being compiled in the log 108 for that phrase.

Searching the data in the log 108 for the targeted data may additionally include searching for a flag and/or a sequence present in the log 108. For example, searching the data in the log 108 may include searching for sequences of specific text, sequences of specific characters, sequences of specific phrases, sequences of specific events that are indicative of and/or are themselves the targeted data. That is, text, words, phrases, and/or characters occurring at specific times, in specific frequencies, in specific orders, etc. among the data being compiled in the log 108 may be indicative of and/or themselves be targeted data.

For example, the appearance of a particular sequence of events or characters in the log 108 may be indicative of an error and/or an event leading to an error that is of particular interest to an administrator. As such, searching the data log may include performing a search of the data being compiled in the log 108 for that particular sequence of events or characters.

Alternatively, the appearance of a particular sequence of events or characters in the log 108 may be indicative that the preceding data and/or events compiled in the log 108 are correct and/or non-erroneous and, as such, of little interest to an administrator. As such, searching the data log may include performing a search of the data being compiled in the log 108 for that particular sequence of events or characters.

In addition to the text searches described above, searching the data being compiled in the log 108 may include executing and applying machine learning models to process the data being compiled in the log and identify targeted data. For example, the compression manager 110 may include instructions executable by the processor 104 to apply a machine learning model to the data being compiled in the log 108. For example, a recursive neural network (RNN) model for identifying targeted data among the data being compiled in the log 108 and/or for identifying data to be targeted as targeted data may be applied to the data being compiled in the log 108 in order to identify targeted data.

Regardless of the data searching mechanism employed to analyze the log 108, the log 108 analysis may be performed during and/or simultaneous with an execution of a computing operation from which the log 108 is being compiled. In some examples, the data being generated by the execution of the computing operation and compiled into the log 108 may be analyzed on the fly. Analyzing the data on the fly may include analyzing the data in real time as it is generated and/or compiled into the log 108. That is, analyzing the data on the fly may include near instantaneous and/or continuous analysis of the data being compiled into the log 108. Again, the data may be analyzed prior to completion of the execution of the computing operation of the main program that is spawning the log 108 data.

In some examples, the data being generated by the execution of the computing operation and compiled into the log 108 may be analyzed in data frames. For example, analysis of the data may be periodic or done in batches. In an example, the analysis of the data may be delayed until a certain quantity of data and/or unanalyzed is compiled in the log 108. In some examples, the analysis of the data may be delayed until a certain quantity of time (e.g., X fractions of a second, Y seconds, Z minutes, etc.) has passed since a previous analysis of the data being compiled in the log 108 was performed. For example, the analysis of the data may be scheduled to occur every two seconds during execution of the computing operation of the main computing program that is spawning the log 108 data. Again, the data may be analyzed prior to completion of the execution of the computing operation of the main program that is spawning the log 108 data.

As described above, the compression manager 110 may include instructions retrievable from the memory resource 106 and executable by the processor 104 to analyze the log 108 in order to identify targeted data within the log 108. As such, the analysis of the data in the log 108 may be performed utilizing a portion of the processor 104 capacity and/or a portion of the memory resource 106 capacity that would otherwise be available to be utilized in the execution of the operation. For example, the analysis of the data in the log 108 may be performed by retrieving and/or executing compression manager 110 instructions from a portion of the memory resource 106 that also includes the instructions to execute the computing operation of a main computing program that is spawning the log 108 data.

The compression manager 110 may include instructions executable by the processor 104 to compress the log 108 into a compressed log 112. The compressed log 112 may include less data than the log 108. That is, the compressed log 112 may include a version of the log 108 with some data removed. Compressing the log 108 into the compressed log 112 may include compressing the data of the log 108 during the execution of the computing operation of the main computing program that is spawning the log 108 data.

Compressing the log 108 may include modifying the data in the log 108 to transform the log 108 into a compressed log 112. The modification to the data in the log 108 may be based on the results of the previously described analysis of the system log 108. For example, compressing the log 108 may include removing data from the log 108 to transform the log 108 into a compressed log 112. The data to be removed from the log 108 to generate the compressed log 112 and/or the data from the log 108 to be kept in the compressed log 112 may be identified based on the target data identified by the previously described analysis.

For example, targeted data identified in the log 108 that is indicative of and/or is itself an event of interest may be extracted from the log 108 and used to generate a compressed log 112. The rest of the data from the log 108 may be discarded from the log 108 and/or excluded from the compressed log 112. Likewise, targeted data identified in the log 108 that is indicative of and/or is itself demonstrative of a lack of an event of interest may be discarded from the log 108 and/or excluded from the compressed log 112. As such, compressing the log 108 may result in generating a compressed log 112 that contains less data than its precursor log 108 and/or that contains only data identified as being of particular interest to a specific user, administrator, analytics platform, etc.

As described above, the analysis of the log 108 to identify the targeted data may be performed during the execution of the computing operation from which the log 108 is being compiled in the memory resource 106 and/or prior to a completion of the log 108. Likewise, the compression of the log 108 to a compressed log 112 may occur during the execution of the computing operation from which the log 108 is being compiled in the memory resource 106 and/or prior to a completion of the log 108. That is, the compression manager 110 may include instructions executable by the processor 104 to compress the log 108 to a compressed log 112 on the fly in real time as the data being compiled into the log 108 is analyzed. The compression of the log 108 to a compressed log 112 may be continuous during the compilation of the data into the log 108.

In some examples, the compression manager 110 may include instructions executable by the processor 104 to compress the log 108 to a compressed log 112 in data frames. The compression of the log 108 to a compressed log 112 may be performed periodically and/or in batches during the compilation of the data into the log 108. For example, the data in the log 108 may be compressed to generate the compressed log 112 after a certain amount of uncompressed data is reached during the compilation of the data into the log 108 and/or after the passage of a certain period of time since a previous compression operation during the compilation of the data into the log 108.

In addition to being compiled and analyzed within the memory resource 106, the data in the log 108 may also be compressed within the memory resource 106. That is, compressive operations to remove data from the log 108 to generate the compressed log 112 may be performed on the data in the memory resource 106 during execution of the underlying computing operation spawning the data. As such, compressing the data in the log 108 may remove data from the memory resource 106. As such, the portions of the memory resource 106 that were previously occupied by the data removed through compression are freed up to accept additional data and/or to be utilized in the execution of the underlying computing operation (e.g., to contain instructions executable to perform the underlying computing operation, to contain data to be utilized in performing the underlying computing operation, to contain data resulting from the underlying computing operation, to contain additional log data, etc.). Accordingly, out of memory errors in the computing system 102 may be reduced or eliminated by reducing the portion of the capacity of the memory resource 106 that is occupied by the log 108 prior to a completion of a compilation of the log 108, thereby freeing that capacity up to be utilized in the computing operations of the main computing program.

As the data is compiled into the log 108 it may be compiled in an unstructured format, a semi-structured format, and/or in a first format that is not compatible with or tailored to a specific type of analysis to be performed on the data. For example, the data may be compiled into the log 108 as consecutive lines of raw data in the sequence that they were generated. The analysis of the log 108 and the compression of the log 108 may be performed on the unstructured data in the log 108. The compression manager 110 may include instructions executable by the processor 104 to format and/or reformat the data in the log 108 to a different structure in the compressed log 112.

For example, the identified targeted data within the log 108 may be retained for inclusion in the compressed log 112. The identified targeted data from the log 108 may be formatted and/or reformatted from its native format in the log 108 to, for example, a tabular format or a summary format for the compressed log 112 that is specifically tailored to further analysis (e.g., debugging) that may be conducted on the log data following compression.

In order to free up additional memory capacity in the memory resource 106, the compression manager 110 may include instructions executable by the processor 104 to move the compressed log 112 out of the memory resource 106 and to another memory resource (not illustrated). For example, the compressed log 112 may be moved on the fly. That is, the compressed log 112 may be moved from the memory resource 106 to another resource as the data from the log 108 is compressed. That is, the data remaining in the compressed log 112 may be moved continuously and/or simultaneous with its inclusion in the compressed log 112.

The compressed log 112 may be moved from the memory resource 106 to another resource prior to a completion of the execution of the computing operation of the main program and/or prior to a completion of the compilation of data from that execution into the log 108. Therefore, the compressed log 112 that is moved from the memory resource 106 to another resource may not be the complete log that will result from the completed execution of the computing operation of the main program. Rather, the compressed log 112 that is moved from the memory resource 106 to another resource may be the result of the analysis and compression of only a portion of the complete log that will result from the completed execution of the computing operation of the main program. That is, the data in the log 108 may be analyzed and compressed in a piecemeal fashion until completion of the execution of the computing operation of the main program. As a result, a plurality of compressed logs 112 may be generated during the execution of the computing operation of the main program. Therefore, each of a plurality of compressed logs, respectively representing a portion of the entire data that will be compressed from a full and complete execution of the computing operation of the main program, may be moved to another memory resource as they are generated.

Alternatively, the compressed log 112 may be moved out of the memory resource 106 and to another memory resource periodically. For example, the compressed log 112 may be moved out of the memory resource 106 and to another memory resource according to a schedule. For example, the compressed log 112 may be scheduled to be moved from the memory resource 106 and to another memory resource every two seconds during execution of the computing operation of the main computing program that is spawning the log 108 data.

Moving the compressed log 112 from the memory resource 106 to another memory resource may include moving the compressed log to a different type of memory resource. For example, the memory resource 106 may be volatile memory, whereas the another memory resource may be a non-volatile memory resource. In some examples, the memory resource 106 may be the RAM memory of the computing system 102, whereas the another memory resource may include a hard drive of the computing system 102. The memory resource 106 may be a dynamic random-access memory (DRAM) resource or a static random-access memory (SRAM) resource, whereas the another memory resource may be a solid state drive (SDD) utilizing NAND flash memory for storage. As such, the memory resource 106 may be able to store and retrieve data at a faster rate than the another memory resource.

By clearing the compressed log 112 from the memory resource 106 during the execution of the computing operation of the main program, additional memory capacity of the memory resource 106 may be freed up. As such, the portions of the memory resource 106 that were previously occupied by the compressed log 112 may be freed up to accept additional data and/or to be utilized in the execution of the underlying computing operation (e.g., to contain instructions executable to perform the underlying computing operation, to contain data to be utilized in performing the underlying computing operation, to contain data resulting from the underlying computing operation, to contain additional log data, etc.). Accordingly, out-of-memory errors in the computing system 102 may be reduced or eliminated by reducing the portion of the capacity of the memory resource 106 that is occupied by the compressed log 112 prior to a completion of a compilation of the log 108 and/or prior to the completion of the execution of the computing operation of the main program. That is, the freed-up memory capacity in the memory resource 106 may then be utilized in executing the computing operations of the main computing program preventing an out of memory error from being triggered.

In addition to the above described analysis, compression, and moving of the log data, the compression manager 110 may include instructions executable by the processor 104 to analyze the non-log data within the memory resource 106 that is generated by execution of the main computing operations of the main computing program to identify targeted data (e.g., specific statistical outputs from the application of a model to a data set, etc.) among the non-log data being generated thereby. Again, this analysis may be conducted prior to a completion of the execution of the computing operation of the main program. Likewise, the compression manager 110 compression manager 110 may include instructions executable by the processor 104 to compress, prior to a completion of the execution of the computing operation of the main program, the non-log data within the memory resource 106 that is generated by execution of the main computing operations of the main computing program based on the analysis. Further, the compression manager 110 compression manager 110 may include instructions executable by the processor 104 to move the compressed non-log data from the memory resource 106 to the another memory resource prior to a completion of the execution of the computing operation of the main program. Removing the compressed non-log data may also free-up memory capacity in the memory resource 106 which may then be utilized in executing the computing operations of the main computing program preventing an out of memory error from being triggered.

Figure 2:
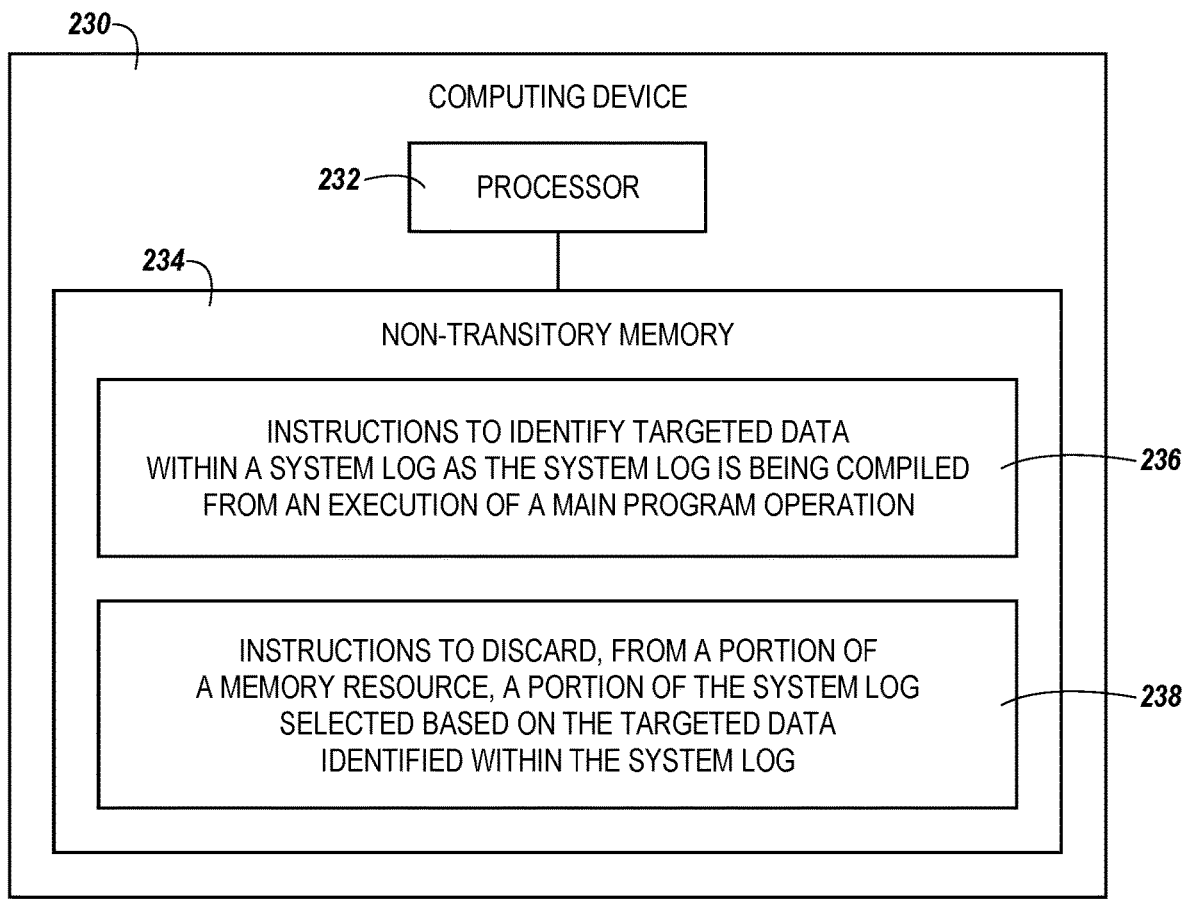
FIG. 2 illustrates an example of a computing device for log compression consistent with the present disclosure.

FIG. 2 illustrates an example of a computing device 230 for log compression consistent with the present disclosure. The described components and/or operations described with respect to the computing device 230 may include and/or be interchanged with the described components and/or operations described in relation to FIG. 1 and FIG. 3-FIG. 4.

The computing device 230 may include a server, a laptop computer, desktop computer, a tablet computer, smartphone, smart device, IOT device, etc. The computing device 230 may include a processor 232 and/or a non-transitory memory 234. The non-transitory memory 234 may include instructions (e.g., 236, 238, etc.) that, when executed by the processor 232, cause the computing device 230 to perform various operations described herein. While the computing device 230 is illustrated as a single component, it is contemplated that the computing device 230 may be distributed among and/or inclusive of a plurality of such components.

The computing device 230 may include instructions 236 executable by the processor 232 to identify targeted data within a system log. The system log may include data such as log data and statistical data indicative of a health of the computing device 230. The system log may be being compiled from data generated by the execution of a main computing program's computing operation. A main computing program may include an operating system and/or a computing application being executed by the computing device 230. The targeted data within the system log may be identified by analyzing the system log as the system log is being compiled from the execution of the main computing program's computing operation. The system log may be being compiled in a memory resource.

The memory resource may be a same memory resource that is being utilized to execute the main computing program's computing operation. For example, the memory resource may be a volatile RAM memory resource where data being utilized for the execution of the main computing program's computing operation is also kept for access by the processor. That is, the memory resource may be the same RAM that is being utilized for the execution of the main computing program's computing operation. That is, of the memory resource that is utilized in the execution of the main computing program's operation, a portion may include the data for the system log. As such, the same memory resource may be utilized for execution of the main computing program's operation from which a system log is compiled and for identifying targeted data within a system log along with discarding a portion of the system log selected based on the targeted data identified within the system log.

To identify the targeted data within a system log, an analysis of the system log may be performed within the memory resource while the system log is being compiled. That is, the analysis and/or resulting identification may be performed utilizing a portion of the memory resource that would otherwise be available to be utilized in the execution of the main computing operation in order to analyze the system log data that is being compiled in the same memory resource as a result of the execution of the main computing operation.

The analysis may include an analysis of the system log data being compiled in the system log to identify targeted data among the system log data. The targeted data may include data within the system log that is of particular utility to a subsequent analysis and should be retained and/or targeted data within the system log that is not of particular utility to a subsequent analysis and should be discarded. The identity of targeted data may be based on a definition and/or definition parameters provided by a user, administrator, analytics platform, etc. That is, the data of particular interest for an analysis may be defined by and/or unique to a particular user, administrator, analytics platform, etc.

The analysis of the system log data and/or the resulting identification of the targeted data within the system log may be performed continuously and/or simultaneous with the generation and/or compilation of the system log data into to the system log. In some examples, a portion of the system log may be accumulated, within the memory resource, across a time interval window prior to a completion of a compilation of the system log. For example, log data may be accumulated for two seconds in the system log during the execution of the main computing operation. After the two seconds has lapsed, the accumulated data in the system log may be analyzed. That is, the system log may be analyzed by searching the accumulated portion of the system log after a completion of a compilation of the accumulated portion and prior to a completion of a compilation of the entire system log for the execution of the main computing operation. This process may be repeated every consecutive two second period of time until the compilation of the entire system log is completed for the execution of the main computing operation and/or until the execution of the main computing operation that is generating the log data is entirely completed.

The computing device 230 may include instructions 238 executable by the processor 232 to compress the system log. Since the system log is being compiled and analyzed within the same memory resource that is being utilized to execute the computing operations of the main computing program, the compression may also be performed by discarding data within the same memory resource. Further, since the compilation, analysis of, and/or identification of targeted data within the system log occurs during the execution of the computing operation and/or prior to a completion of the execution of the computing operation, the compression may also be performed during the execution of the computing operation and/or prior to a completion of the execution of the computing operation.

Compressing the system log may include reducing the amount of data stored in the system log while the system log is being compiled and/or prior to a completion of the execution of the computing operation spawning the log. For example, compressing the system log may include discarding, from a portion of a memory resource, a portion of the system log stored thereupon. As described above, the memory resource where the system log is being compiled may be the same memory resource being utilized to execute computing operations of the main computing program. As such, the unused capacity of the memory resource may be available to be utilized in the execution of the computing operation of the main computing program. Therefore, discarding the portion of the system log from the memory resource may free up additional unused capacity to be utilized in the execution of the computing operation of the main computing program.

The portion of the system log that is to be discarded during compression may be selected based on the identified targeted data within the system log. For example, the above described analysis may identify targeted data within the system log. The presence of the targeted data within the system log may be indicative of and/or itself be system log data that is of particular utility to a subsequent analysis. As such, that system log data may be selected to be retained from the system log. Conversely, the system log data that is not the targeted data and/or is not indicated by the targeted data to be of particular utility to a subsequent analysis, may be selected to be among the system log data discarded during compression.

In some examples, non-system log data may also be compressed in the memory resource. For example, non-system log data that is generated by the execution of the main computing program's computing operation may also be compressed prior to a completion of the execution of the main computing program's computing operation. The compression may include discarding portions of the non-system log data within the memory resource that is generated by the execution of the main computing program's computing operation. The non-system log data within the memory resource to be discarded may be selected based on an analysis of the non-system log data, as it is saved into the memory resource, that identified targeted data among the non-system log data.

In both the system log data and non-system log data examples described above, the non-discarded and/or targeted data in the memory resource following compression may be pushed and/or written to a different memory resource. In some examples, the different memory resource may be a non-volatile memory resource. The different memory resource may include a memory resource that is not directly involved in the execution of the main computing program's computing operations. For example, the different memory resource may include an SSD memory drive of the computing device 230 that is not directly accessed by the processor 232 during the execution of the main computing program's computing operations.

Compressing system log data and/or non-system log data within the memory resource and pushing and/or writing the compressed system log data and/or non-system log data from the memory resource to a different memory resource frees up capacity in the memory resource. As described above, unused capacity of the memory resource is available to be utilized in the execution of the main computing program's computing operation. Compressing system log data and/or non-system log data within the memory resource and pushing and/or writing the compressed system log data and/or non-system log data from the memory resource to a different memory resource returns the previously occupied capacity to unused capacity available for execution of the main computing program's computing operation. Therefore, compressing system log data and/or non-system log data within the memory resource and pushing and/or writing the compressed system log data and/or non-system log data from the memory resource to a different memory resource may reduce and/or eliminate out of memory errors in the computing device 230.

Figure 3:
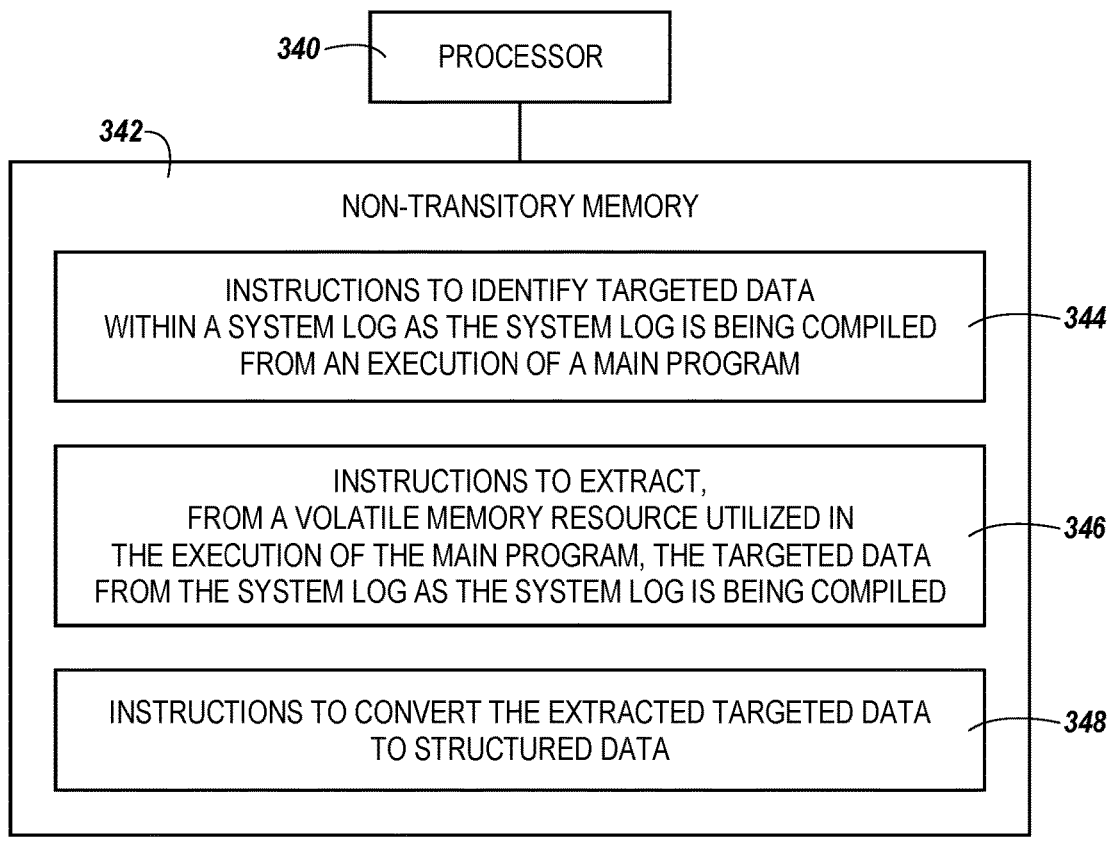
FIG. 3 illustrates an example of a non-transitory machine-readable memory and processor for log compression consistent with the present disclosure.

FIG. 3 illustrates an example of a non-transitory machine-readable memory 342 and processor 340 for log compression consistent with the present disclosure. A memory resource, such as the non-transitory machine-readable memory 342, may be utilized to store instructions (e.g., 344, 346, 348, etc.). The instructions may be executed by the processor 340 to perform the operations as described herein. The operations are not limited to a particular example described herein and may include and/or be interchanged with the described components and/or operations described in relation to FIG. 1-FIG. 2 and FIG. 4.

The non-transitory memory 342 may store instructions 344 executable by the processor 340 to identify targeted data within a system log. Identifying targeted data within the system log may include analyzing the data being compiled within the system log as it is being compiled from an execution of a computing operation of a main computing program.

The log data may be compiled in a system log stored in a first portion of a volatile memory resource. Specifically, the volatile memory resource may be a volatile memory resource whose other portions are being utilized in the execution of the computing operation of the main computing program that is spawning the log data. As such, the analysis of the system log may include analysis of log data within the first portion of the volatile memory resource where the system log is being compiled. That is, of the memory resource that is utilized in the execution of the main computing program's operation, a portion may include the data for the system log. As such, the same memory resource may be utilized for execution of the main computing program's operation from which a system log is compiled and for identifying targeted data within a system log along with the extraction of the identified targeted data from the system log within the resource during the execution of the operation.

The log data being compiled in the system log may be analyzed to identify targeted data among the data within the system log. For example, the data within the system log may be searched for the presence of targeted data. The data within the system log may be searched as the system log is being compiled.

The targeted data may include logs triggered by system activity indicative of a source of errors occurring during the execution of the computing operation of the main computing program. For example, the targeted data may include particular sequences of key refreshes, service restarts, database syncs, login timestamps, error messages, etc. resulting from the execution of the computing operations of the main computing program.

A user interface may be provided that facilitates the configuration of the identity of the data to be targeted by the analysis. The identity of the targeted data may be determined based on the indications received at this user interface which define the characteristics and/or identity of the targeted data.

The non-transitory memory 342 may store instructions 346 executable by the processor 340 to extract the targeted data from the system log. As described above, the analysis of the system log may be utilized to identify targeted data within the system log. The system log may be compiled and analyzed in the volatile memory resource that is also being utilized in the execution of the computing operation of the main computing program. The targeted data identified within the system log may be extracted, as the system log is being compiled, from its storage location in the volatile memory resource.

Extracting the targeted data may include reducing the size of the system log by deleting portions of the system log prior to a completion of a compilation of the system log. For example, the non-extracted portions of the system log may be deleted from the system log prior to a completion of a compilation of the system log. Additionally, redundant instances of the targeted data may be removed from the system log in the volatile memory resource prior to a completion of a compilation of the system log.

As such, the extraction of targeted data from the system log may result in a compressed system log. The compressed system log may include less data than the uncompressed system log used as the source for the compressed system log. As such, more of the volatile memory resource capacity may be freed up to handle other data associated with the execution of the computing operation of the main computing program being performed utilizing the volatile memory resource. Additionally, since the analysis and/or extraction may occur prior to a completion of the compilation of the system log and/or completion of the execution of the computing operation, the volatile memory resource capacity may be freed up during the execution of the computing operation when it could potentially be utilized, rather than after the execution has concluded or failed.

The non-transitory memory 342 may store instructions 348 executable by the processor 340 to convert the extracted targeted data to structured data. The extracted targeted data may be unstructured, semi-structured, and/or have a structure that is not compatible with analysis protocols to be subsequently applied to the data. As such, the extracted targeted data may be structured and/or restructured to a data structure that is compatible with the subsequently applied analysis protocols. For example, converting the extracted targeted data to structured data may include compiling a summary statistics report for the extracted targeted data. That is, converting the extracted data to structured data may include analyzing the extracted data, determining summary statistics for the data, and/or formatting the summary statistics in a tabular format compatible with subsequently applied analysis protocols and/or able to be rapidly assessed and/or comprehended by a user.

The extracted targeted data may be converted to structured data prior to a completion of a compilation of the system log. That is, the conversion may be performed as the system log is still being compiled from the execution of a computing operation of the main computing program. In some examples, the conversion may be performed on a portion of the system log data that was present in the volatile memory when the analysis and extraction where conducted, but any system log data that has accumulated in the volatile memory since then may be the subject of subsequent analysis, extraction, and/or conversion to structured data.

Additionally, the structured data may be sent from the volatile memory resource to a non-volatile memory resource for storage. The structured data may be sent to the non-volatile memory resource for storage prior to a completion of a compilation of the system log. That is, the structured data may be sent to the non-volatile memory resource for storage as the system log is still being compiled from the execution of a computing operation of the main computing program. In some examples, the structured data may be sent to the non-volatile memory resource for storage for a portion of the system log data that was present in the volatile memory when the analysis, identification, extraction, and conversion where conducted, but any system log data that has accumulated in the volatile memory since then may be the subject of subsequent analysis, identification, extraction, conversion, and/or sending to the non-volatile memory resource for storage.

The analyzed portions of the system log may be deleted from the volatile memory resource subsequent to the sending of the structured data to the non-volatile memory resource for storage. That is, once the extracted and structured data generated from analysis of a portion of the system log data in the volatile memory is completed, the source system log data in the volatile memory may be deleted from the volatile memory. Again, this deletion may occur prior to a completion of a compilation of the system log. In this manner, while the compilation of the system log data into the system log proceeds, portions of the volatile memory storing already analyzed, extracted, and converted data may be freed up to further participate in the execution of the computing operation of the main computing program.

Figure 4:
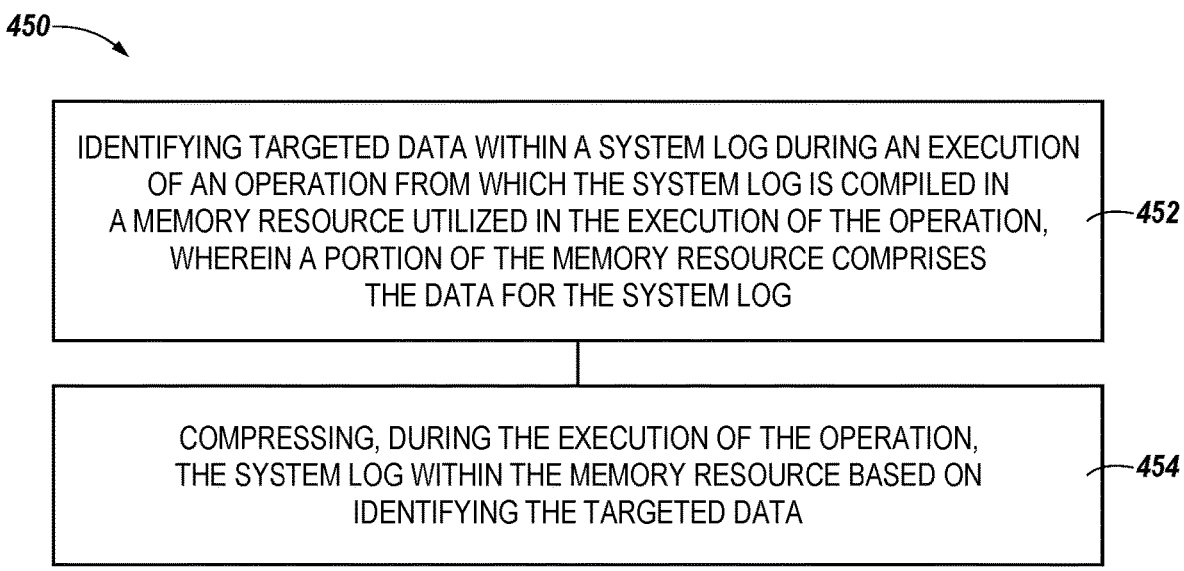
FIG. 4 illustrates an example of a method for log compression consistent with the present disclosure.

FIG. 4 illustrates an example of a method 450 for log compression consistent with the present disclosure. The described components and/or operations of method 450 may include and/or be interchanged with the described components and/or operations described in relation to FIG. 1-FIG. 3.

At 452, the method 450 may include identifying targeted data within a system log during an execution of a computing operation from which the system log is compiled. For example, targeted data may be identified within the system log by analyzing the system log to search from the targeted data during an execution of a computing operation from which the system log is being compiled. The system log may be being compiled in a memory resource.

The memory resource may be a same memory resource that is being utilized to execute the computing operation. As such, the identification of the targeted data may be performed within the memory resource while the system log is being compiled. That is, the analysis of the system log to search for the targeted data may be performed utilizing a portion of the memory resource that would otherwise be available to be utilized in the execution of the operation. That is, of the memory resource that is utilized in the execution of the operation a portion may include the data for the system log. As such, the same memory resource may be utilized for execution of the operation from which a system log is compiled and for identification of targeted data along with the compressing the system log within the resource during the execution of the operation.

Identifying targeted data within the system log may include an analysis of the system log data being compiled in the system log to identify targeted data contained therein. The targeted data may include data within the system log that is of particular utility to a subsequent analysis and should be retained and/or targeted data within the system log that is not of particular utility to a subsequent analysis and should be discarded. The identity of targeted data may be based on a definition and/or on definition parameters provided by a user, administrator, analytics platform, etc. That is, the data of particular interest for an analysis may be defined by and/or unique to a particular user, administrator, analytics platform, etc.

Identifying targeted data within the system log may include the application of a machine learning model to the data being compiled in a system log to identify targeted data within the system log that is of particular utility to a subsequent analysis and should be retained and/or targeted data within the system log that is not of particular utility to a subsequent analysis and should be discarded. In some examples, that analysis may include analyzing the data being compiled in the system log utilizing a recursive neural network trained to analyze characters within the system log and identify the targeted data among the characters. As described above, the identity of targeted data may be based on a definition and/or on definition parameters provided by a user, administrator, analytics platform, etc. As such, the recursive neural network may be trained to identify the targeted data within the system log based on the definition and/or definition parameters provided by a user, administrator, analytics platform, etc.

In some examples, identifying targeted data within the system log include analyzing data being compiled in the system log by performing a regular expression pattern search of the characters within the system log to identify the targeted data among the characters within the system log. In some examples, the analysis may include analyzing the system log by searching the characters within the system log for a flag sequence to identify the targeted data among the characters within the system log.

The analysis of the data being compiled in the system log and/or the resulting identification of targeted data may be performed prior to the completion of an execution of a computing operation of a main computing program that is spawning the data being compiled into the system log. That is, the analysis of the data and/or the resulting identification of targeted data may occur simultaneous with the compilation of the log data and/or prior to the completion of the entire log file associated with the execution of the computing operation.

At 454, the method 450 may include compressing the system log within the memory resource. Since the system log is compiled within the memory resource being utilized to execute the computing operations of the main computing program and since the analysis of the system log may be performed within the memory resource during the execution and/or prior to a completion of the execution, the compression may also be performed within the memory resource and during the execution of the computing operation.

Compressing the system log may be performed based on the above described identification of the targeted data. That is, how to compress the data, which data to extract, which data to keep, which data to delete, etc. may be determined based on the results of the above described analysis and/or its identified targeted data. For example, the identified targeted data within the system log may be indicative of the identify data that should be retained from the system log and/or data that should not be retained in the system log.

Compressing the system log may include reducing the amount of log data stored in the system log during the execution of the underlying computing operation and while the system log is still being compiled. Reducing the amount of log data stored in the system log may include deleting, from the system log in the memory resource, log data other than targeted data identified within the system log. That is, reducing the amount of log data stored in the system log may include deleting all non-targeted log data and/or all data that is not indicated by the targeted data to have a particular utility worthy of saving (e.g., particular utility in performing subsequent analysis such as debugging operations). To further reduce the amount of log data stored in the system log during the execution of the underlying computing operation and while the system log is still being compiled, the targeted log data spared from deletion in the system log may be pushed and/or written to a different memory resource. For example, the targeted log data may be pushed and/or written to an SSD memory resource that is not being actively used in the execution of the computing operation of the main computing program that is spawning the system log data.

Additionally, compressing the data may include reducing the amount of log data stored in the system log by extracting the targeted data from the system log to generate a compressed system log during the execution of the underlying computing operation and while the system log is still being compiled. The data remaining in the system log within the portion of the system log that the targeted data was extracted from may be deleted. The extracted data may be included in a compressed system log in the memory resource. To further reduce the amount of log data stored in the system log during the execution of the underlying computing operation and while the system log is still being compiled, the data representative of the compressed system log may be pushed and/or written from the memory resource to a different memory resource. For example, the targeted log data may be pushed and/or written to an SSD memory resource that is not being actively used in the execution of the computing operation of the main computing program that is spawning the system log data.

By compressing the system log within the memory resource during the execution of the computing operation spawning the system log data, additional memory capacity may be freed-up in the memory resource. By pushing and/or writing the compressed system log data from the memory resource to a different memory resource, even more memory capacity may be freed-up in the memory resource. The free capacity in the memory resource may be utilized to store additional data associated with the execution of the computing operation including additional system log data, additional computing program data, additional input data, additional output data, etc. Therefore, compressing system logs in a memory resource and pushing and/or writing the system logs from the memory resource during execution of the computing operation may reduce or eliminate the occurrence of out of memory errors. Moreover, the demand placed on the memory resource during execution of a computing operation may be reduced, thereby allowing computing systems to be constructed with less of the relatively expensive volatile memory that is utilized during execution of a computing operation. That is, the examples consistent with the present disclosure may reduce the incidence of volatile memory capacity acting as a bottleneck in executing computing operations.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. Further, as used herein, "a plurality of" an element and/or feature can refer to more than one of such elements and/or features.

The figures herein follow a numbering convention in which the first digit corresponds to the drawing figure number and the remaining digits identify an element or component in the drawing. Elements shown in the various figures herein may be capable of being added, exchanged, and/or eliminated so as to provide a number of additional examples of the disclosure. In addition, the proportion and the relative scale of the elements provided in the figures are intended to illustrate the examples of the disclosure and should not be taken in a limiting sense.

What is claimed:

1. A method, comprising:
    analyzing, during an execution of a computing operation from which a system log is compiled in a volatile memory resource utilized in the execution of the operation, the system log to identify targeted data within the system log, wherein the analysis is performed utilizing a portion of the volatile memory resource that would otherwise be available to be utilized in the execution of the computing operation;
    wherein the portion of the volatile memory resource comprises the data for the system log; and
    compressing, during the execution of the computing operation, the system log stored within the volatile memory resource based on identifying the targeted data.

2. The method of claim 1, comprising extracting, from the system log in the memory resource, the targeted data identified within the system log.

3. The method of claim 1, comprising deleting, from the system log in the memory resource, data other than the targeted data identified within the system log.

4. The method of claim 1, comprising utilizing a recursive neural network to identify characters within the system log corresponding to the targeted data.

5. The method of claim 1, comprising performing a regular expression pattern search to identify characters within the system log corresponding to the targeted data.

6. The method of claim 1, comprising searching characters within the system log for a flag sequence to identify the targeted data within the system log.

7. The method of claim 1, comprising writing data representative of the compressed system log to a second memory resource.

8. A system, comprising:
a processor; and
a non-transitory machine-readable storage medium to store instructions executable by the processor to:
generate and compile data that makes up a system log in a memory resource as instructions for performing a main program operation are retrieved from the memory resource and executed by the processor;
identify targeted data within the system log as the system log is being compiled from the execution of the main program operation; and
discard, from a portion of the memory resource, a portion of the system log selected based on the targeted data identified within the system log.

9. The system of claim 8, wherein the memory resource is a volatile random-access memory resource where data being utilized for the execution of the main program operation is kept for access by the processor.

10. The system of claim 9, including instructions executable by the processor to write the targeted data to a different memory resource, wherein the different memory resource is a non-volatile memory resource.

11. The system of claim 8, including instructions executable by the processor to compress non-system log data, in the memory resource, generated by the execution of the main program operation prior to a completion of the execution of the main program operation.

12. The system of claim 8, including instructions executable by the processor to accumulate, within the memory resource, a portion of the system log across a time interval window prior to a completion of the compilation of the system log.

13. The system of claim 12, including instructions executable by the processor to search the accumulated portion of the system log after a completion of a compilation of the accumulated portion and prior to a completion of the compilation of the system log.

14. The system of claim 8, wherein the system log includes log data and statistical data indicative of a health of the system.

15. A non-transitory machine-readable storage medium comprising instructions executable by a processor to:
generate and compile data that makes up a system log in a memory resource as instructions for performing a main program operation are retrieved from the memory resource and executed by the processor;
identify targeted data within the system log as the system log is being compiled from the execution of a main program;
extract, from a volatile memory resource utilized in the execution of the main program, the targeted data from the system log as the system log is being compiled; and
convert the extracted targeted data to structured data.

16. The non-transitory machine-readable storage medium of claim 15, wherein the targeted data includes logs trigged by system activity indicative of a source of errors occurring during the execution of the main program.

17. The non-transitory machine-readable storage medium of claim 15, including instructions executable by the processor to convert the extracted targeted data to structured data by compiling a summary statistics report for the extracted targeted data.

18. The non-transitory machine-readable storage medium of claim 15, including instructions executable by the processor to:
write the structured data from the volatile memory resource to a non-volatile memory resource for storage prior to a completion of the compilation of the system log; and
delete analyzed portions of the system log from the volatile memory resource.

19. The non-transitory machine-readable storage medium of claim 15, including instructions executable by the processor to configure an identity of the targeted data based on an indication received at a user interface.

20. The non-transitory machine-readable storage medium of claim 15, including instructions executable by the processor to remove redundant instances of the targeted data from the system log in the volatile memory resource prior to a completion of the compilation of the system log.

* * * * *